United States Patent
Shuvalov

(10) Patent No.: US 10,785,065 B2
(45) Date of Patent: Sep. 22, 2020

(54) ISOLATION CIRCUIT AND METHOD THEREFOR

(71) Applicant: NXP B.V., Eindhoven (NL)

(72) Inventor: Denis Sergeevich Shuvalov, Munich (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/918,094

(22) Filed: Mar. 12, 2018

(65) Prior Publication Data
US 2019/0280903 A1 Sep. 12, 2019

(51) Int. Cl.
*H04L 25/02* (2006.01)
*G01R 31/382* (2019.01)
(Continued)

(52) U.S. Cl.
CPC ........ *H04L 25/0278* (2013.01); *G01R 31/382* (2019.01); *G06F 13/4022* (2013.01); *H01M 10/425* (2013.01); *H04L 25/0266* (2013.01); *H04L 25/0272* (2013.01); *G06F 13/4086* (2013.01); *G06F 13/4247* (2013.01); *H01M 2010/4271* (2013.01); *H01M 2010/4278* (2013.01); *H04L 61/2038* (2013.01)

(58) Field of Classification Search
CPC ............. H04L 25/0278; H04L 25/0266; H04L 25/0272; G01R 31/382; H01M 10/425; H01M 2010/4271; H01M 2010/4278
See application file for complete search history.

(56) References Cited

U.S. PATENT DOCUMENTS 8,908,779 B2    12/2014   Douglass
2011/0103274 A1*  5/2011   Vavik ................. H04B 3/54
                                                      370/293
(Continued)

FOREIGN PATENT DOCUMENTS

EP         2518957 B1    11/2013

OTHER PUBLICATIONS

J. Munson, "Enabling Robust Data Communications Within a High Voltage BMS," EDN Network (May 31, 2016).
(Continued)

*Primary Examiner* — Sam K Ahn
*Assistant Examiner* — Amneet Singh
(74) *Attorney, Agent, or Firm* — Rajeev Madnawat

(57) ABSTRACT

Aspects of the present disclosure are directed to facilitating communications to respective circuit nodes in a manner that may also be useful for mitigating undesirable signal attenuation. As may be implemented in accordance with one or more embodiments, switchable isolation circuits, presented by at least one transformer and switch, are utilized to isolate adjacent data processing nodes on a bus in which each data processing node includes logic circuitry and processes signal therein. For each of the switchable isolation circuits, switching circuitry operates to mitigate communication propagation over the differential bus between adjacent data processing nodes, by switching the switchable isolation circuit for providing isolation. This approach may be utilized, for example, to assign sequential identification to daisy-chained circuit nodes upon start-up or reset, for use in addressing each node directly for further communication therewith.

20 Claims, 2 Drawing Sheets

(51) Int. Cl.
*H01M 10/42* (2006.01)
*G06F 13/40* (2006.01)
*H04L 29/12* (2006.01)
*G06F 13/42* (2006.01)

(56) References Cited

U.S. PATENT DOCUMENTS

| | | |
|---|---|---|
| 2011/0280322 A1* | 11/2011 | Suenaga ............. H04L 25/0278 375/257 |
| 2013/0272314 A1* | 10/2013 | Kuipers .................. H04L 47/52 370/437 |
| 2014/0281079 A1 | 9/2014 | Biskup |
| 2015/0370312 A1 | 12/2015 | Desposito et al. |
| 2017/0010329 A1 | 1/2017 | Tang et al. |
| 2017/0222275 A1 | 8/2017 | Krishnan et al. |

OTHER PUBLICATIONS

"Isolation Transfermers for Battery Management Systems," Pulse Electronics Networking (2012).

* cited by examiner

ISOLATION CIRCUIT AND METHOD THEREFOR

Aspects of various embodiments are directed to mitigating or otherwise controlling attenuation, such as that caused by transformers connected in a daisy-chain bus environment. Such aspects may be applicable in the context of automotive battery management systems.

Battery management systems (BMS) can be implemented in a variety of applications, such to monitor and control battery cells for elective vehicles, hybrid electric vehicles, uninterruptible power supply (UPS) systems, in so-called green energy systems such as solar, wind and wave systems, and in various industrial applications. Control functions, battery health, and battery temperature may be monitored and used for managing individual batteries and battery packs. For instance, battery cells that are underperforming or exhibiting performance issues can be shut down or otherwise bypassed.

In many applications involving high energy requirements, such as in automotive, locomotive, and marine applications, a multitude of batteries are often connected in series and may be separated to facilitate desirable weight distribution. Such applications often utilize relatively high voltage potential differences, which can require isolation between components. It can also be desirable to provide electrical isolation to disturbances in noisy environments, such as in automotive environments.

To enable a practical modular approach with all its associated benefits, it is popular to utilize point-to-point communication in a fully-isolated daisy chain configuration of the bus between BMS of different battery packs. Each node on the daisy chain is dynamically initialized in order of their location, order of battery packs' connectivity, along the bus and incremental cluster identification (CID) is set at power-up (or after a reset) by the pack controller. After the clusters' identification, driven by the pack controller (the master node), the pack controller is enabled to address its messages to specific node with known CID, or, in other words, to perform a point-to-point communication. A daisy chain could be termed "active", if each node of the daisy chain has a signal repeater, such as LTC6811-1/LTC6811-2 ICs offered by Linear Technology of Milpitas, Calif. In this context, the repeater may operate to receive and transmit signals, with either a half-duplex or full-duplex transceiver, communication logic, and other componentry. Correspondingly, to guaranty initializations with incremental CID, each node of an "active" daisy chain, having a repeater controlled by communication logic, does not propagate messages or logically cuts the bus, until the node is initialized by the master node, by the pack controller. Such an "active" daisy chain is suitable for monitoring long, high voltage battery strings, and for communication over long distances to one master processor. Practically, the maximum number of devices in a daisy chain is dictated by the timing requirements and by the current consumption.

For "active" daisy chain applications, noticeable and unmatched current consumption, associated with signal repeaters in "active" node, may create a drawback, concluded in undesired battery cells' charge misbalance along long high voltage battery strings. So-termed "passive" daisy chain bus configurations (with no repeater or amplifier) can be utilized to avoid the drawback mentioned above. Compared to an "active" daisy chain, each node of a "passive" daisy chain has either a half- or full-duplex transceiver which is enabled by demand, when this node is selected by the pack controller for point-to-point communication. To guaranty initializations with incremental CID, each node of the "passive" daisy chain utilizes so termed "bus switches." The use of such bus switches is another difference with respect to an "active" daisy chain, which physically cuts the bus to prevent further propagation of messages until node is initialized by the master node, by the pack controller.

While "passive" daisy chains can be very useful, they may be subject to attenuation of signals by transformers. Further, minimum and maximum operating temperature requirements and characteristics of the transformer may constrain maximum bus length and node count. These and other matters have presented challenges to efficiencies of battery management circuitry and implementations, for a variety of applications.

SUMMARY

Various example embodiments are directed to addressing issues such as those characterized above and/or others that may become apparent from the following disclosure, concerning transformer attenuation and related aspects, such as may be present in battery management systems.

In certain example embodiments, aspects of the present disclosure are directed to a circuit arrangement for use with transformers in nodes of a "passive" daisy chain bus configuration, which facilitate isolation of the nodes and selective mitigation of signal propagation past the nodes on the bus. Such an approach may, for example, be carried out to identify the nodes, such as for assigning an address for subsequently communicating with the nodes.

In a specific example embodiment, a data communication circuit includes a differential bus configured and arranged to convey data differentially, a plurality of data processing nodes including logic circuitry and communicatively coupled to the differential bus, a data logic circuit, and a plurality of switchable isolation circuits. The data logic circuit is configured and arranged to facilitate communications for each of the plurality of data processing nodes over the differential bus by identifying each of the data processing nodes, and by using the identification to communicate with the plurality of data processing nodes. Each of the plurality of switchable isolation circuits includes one or more transformers and switching circuitry, and is configured and arranged with the data logic circuit to mitigate signal propagation over the differential bus between adjacent data processing nodes via switching of the transformer in a way to present high series impedance along the bus.

In accordance with the above embodiment, signal propagation may be mitigated or prevented by using impedance transformation property of transformer to present on the first winding the same impedance as impedance of switching circuitry connected to the second winding, while the data logic circuit assigns an identification to each of the data processing nodes. For instance, this can be carried out sequentially after an initiation event such as a power-up or reset, such that each data processing node blocks propagation of a signal assigning an identification thereto, until that node is identified. This may be carried out, for example, by opening a switch to prevent current flow through the second winding of the transformer where the bus passes through the first winding, magnetically coupled with the second, of the transformer. Once the identification is assigned to a data processing node, that node may cease blocking signal propagation such that a subsequent identification can be assigned to a sequential one of the nodes. Such an approach can be carried out with daisy-chained data processing nodes, with each node initially blocking signal propagation until that node is assigned an identification, and after which the node ignores signals not addressed thereto.

In another specific example embodiment, an apparatus includes a switchable isolation circuit configured and arranged to electrically isolate nodes on a communication bus having at least two bus lines and to selectively mitigate signal propagation on the bus lines. The apparatus also includes communication-logic circuitry in one or more of the nodes that is configured and arranged for connection to the switchable isolation circuit for controlling signal propagation on the bus lines and for communicating data thereon. The switchable isolation circuit includes, for each bus line, a switchable isolation transformer having a first winding configured and arranged for connection in series between the nodes on the bus line, and a second winding configured and arranged via switchable circuitry to effect isolation of the bus line connected in series with the first winding. The communication-logic circuitry includes a logic circuit configured and arranged to, in response to an initiation event in which a first one of the nodes is assigned an identification, mitigate signal propagation on the bus by switching the switchable circuitry, controlling the second winding of each switched transformer, in a corresponding state, and therein mitigating passage of signals through the first winding of each switched transformer. For instance, the nodes may be initialized with an incremental CID after a power-up or reset, by blocking signals from passing by each incremental node to other ones of the nodes while each node is being initialized with a CID. In some application cases, such signal-blocking might be utilized in response to receiving a control-select signal via the bus that identifies the specific node as an intended communication recipient.

A method-based embodiment for communicating between nodes communicatively coupled to a bus having at least two bus lines connected to each of a plurality of circuit nodes, is characterized as follows. In response to an initiation event such as a power-up or reset, a circuit node is used to block signals from passing to other ones of the nodes using a switchable isolation circuit including, for each bus line, a switched isolation transformer having a first winding connected in series between the first node and an adjacent one of the plurality of nodes, and a second winding controlled by switchable circuitry. The respective switchable circuitry arranges the respective transformer to present high series impedance along the bus by each node being initialized, therein mitigating passage of signals on the bus line. The circuit node is identified, such as by assigning an address thereto, while utilizing the switchable isolation circuit to mitigate propagation of signals to the adjacent one of the circuit nodes. After the data processing node has been identified, mitigation of the propagation of signals may be ceased, by allowing the respective switchable circuitry to arrange the respective transformer to present low series impedance along the bus. The switchable circuitry allows current flow in the second winding of the respective transformer, which enables current flow in the first winding of the transformer. After the data processing node identification, the adjacent one of the circuit nodes may be identified using another one of the switchable isolation circuits in a similar manner. This process of isolating and identifying can be carried out for sequential circuit nodes (e.g., in series on the bus) in response to the initiation event, until all circuit nodes have been identified or assigned an address.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
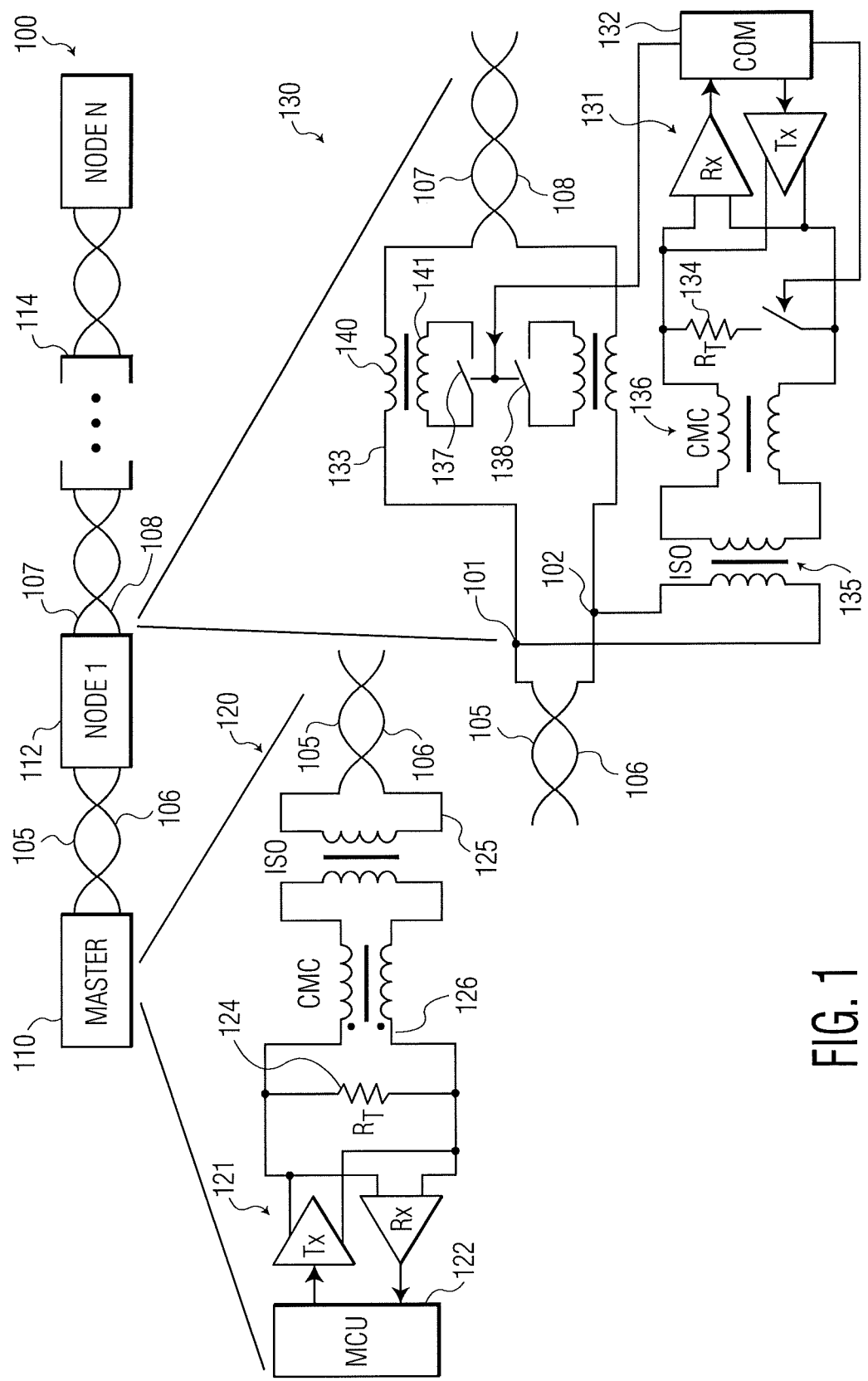
FIG. 1 is an apparatus for implementation with controlling bus communications with circuit isolation, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving circuitry subject to attenuation, such as those involving transformers in battery management systems. In certain implementations, aspects of the present disclosure have been shown to be beneficial when used in the context of "passive" daisy chain coupling of respective battery systems, with control circuitry. Such implementations may involve, for example, electric or hybrid electric vehicle control systems in which each of several battery packs has a BMS, with signals passed between the respective battery packs and controllers.

In some embodiments, data processing or communications nodes, such as for communications involving a battery circuit, include a pair of bus switches having switchable isolation transformers and switchable circuitry that split a differential bus line for signal propagation. More specifically, the switchable isolation transformers and the switchable circuitry allow signals passing on the bus, after a respective communication node, when activated (switched on), and mitigate signal propagation on the bus, after the respective communication node, when deactivated (switched off). This may be carried out, for example, by coupling a signal line of the bus through one of the windings of the transformer. If so, the transformer is activated (switched on) and passing signals on the bus is achieved by allowing current circulation through another winding of the transformer. Correspondingly, the transformer is deactivated (switched off) for mitigation of passing signals on the bus by blocking current circulation though another winding of the transformer. As such, signals passed on the bus (e.g., from a master node) are not passed beyond the respective communication node when that node's switchable isolation transformers and the switchable circuitry are deactivated (switched off). This approach may be used, for example, to sequentially communicate with circuit nodes on the bus, such as for initializing each node by assigning sequential identification thereto. The bus switches facilitate such isolation using transformers that, when operating in a signal-passing mode in which the switchable isolation transformers and the switchable circuitry are switched on, facilitate passage of the signals with relatively low attenuation. While not necessarily so limited, various aspects may be appreciated through the following discussion of non-limiting examples which use exemplary contexts.

A variety of other circuit components can be implemented to facilitate communications. For instance, an isolation transformer, performing DC galvanic isolation of the transceiver of the communication node from the bus, could be reinforced with an external common mode choke transformer and/or selected as center tapped transformer, or a transformer with embedded common mode choke or center tapped transformer with embedded common mode choke, to enhance suppression of common mode noise penetrating from noise aggressors into the bus carrying differential signal. One or more repeaters may be implemented for transmitting or receiving data between the differential bus and at least one of the plurality of data processing nodes. A termination resistor circuit may be utilized in a data processing node to match impedance and therein facilitate communications. In some instances, the termination resistor is coupled via a switch that selectively connects the termination resistor for impedance matching in the node in which the termination resistor is implemented.

Accordingly, in the following description various specific details are set forth to describe specific examples presented herein. It should be apparent to one skilled in the art, however, that one or more other examples and/or variations of these examples may be practiced without all the specific details given below. In other instances, well-known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

In accordance with a specific embodiment, a circuit arrangement of transformers is arranged in nodes of a "passive" daisy chain bus configuration. Respective ones of the nodes are each provided with switchable isolation circuits having a transformer for each communication line on the bus, and one or more switches that selectively engages the transformers for carrying out either transmission or isolation for communication propagation. For instance, communication logic may operate to disengage the transformers, such that current circulation is blocked through a respective winding for mitigating signal propagation, in response to an initiation event or to communication or intended communication between the node for which isolation is being provided, and another node on the network. When signals are to be passed to another node in the network, the transformers are engaged such that current circulation is enabled through the respective windings. By looking from different angle, the switchable isolation circuits may act as a conventional switch circuit, while the switchable isolation transformer provides DC isolation and protects against excessive voltage difference between the bus and the respective switch, which is useful for the bus connecting nodes having relatively high voltage difference between them.

Approaches characterized herein may be useful in a variety of applications, such as in automotive battery systems. For instance, where a master battery controller communicates with individual battery packs for assigning an identification to each pack, or for ascertaining information about each pack that can be utilized in ensuring proper operation or otherwise optimizing operation of a series of battery packs, such communications can be fostered via the isolation and signal propagation control approaches characterized herein.

In another embodiment, a data communication circuit includes a differential bus, data processing nodes communicatively coupled to the differential bus, a data logic circuit connected to the data processing nodes via the differential bus, and a plurality of switchable isolation circuits that operate to isolate adjacent ones of the data processing nodes from one another. Each switchable isolation circuit includes a transformer and switching circuitry that operates the transformer to mitigate signal propagation over the differential bus between adjacent data processing nodes.

In this context, each switchable isolation circuit may "switch" a signal line of the differential bus on and off, to transmit or to isolate. This may be carried out by, for example, coupling one of the signal lines in series with a first winding of the transformer, and selectively switching on and off, correspondingly to the above, a path (switch) for current circulation in a second winding of the transformer. For instance, the second winding may be switched to an open circuit state so that current does not circulate through the winding, which increases the impedance of the first winding of the transformer and mitigates the passage of signals on the first winding. The switchable isolation circuit may be switched, for example, by the data processing node to which it is connected. The data processing node may allow current circulation through the second winding by switching it with the switch to a short circuit state, which decreases impedance of the first winding of the transformer for passing signals on the first winding (e.g., while providing DC isolation for the switch of the data processing node).

The data logic circuit (e.g., a master node) may thus communicate with each of the plurality of data processing nodes using the switchable isolation circuits to limit the propagation of signals to an intended data processing node. For instance, each data processing node may have one of the switchable isolation circuits that is assigned to that node and operable to mitigate signal propagation beyond that node. Such an approach can be used to sequentially assign an identification to each of the data processing nodes, with the identification being used to later communicate directly with each data processing node. This can be carried out sequentially after an initiation event such as a power-up or reset, such that each data processing node blocks propagation of a signal assigning an identification thereto, until that node is identified. Once the identification is assigned to a data processing node, that node may cease blocking signal propagation such that a subsequent identification can be assigned to a sequential one of the nodes. Such an approach can be carried out with daisy-chained data processing nodes, with each node initially blocking signal propagation until that node is assigned an identification, and after which the node ignores signals not addressed thereto.

In certain embodiments, data processing nodes are connected in series on the differential bus, and each data processing node controls operation of one of the switchable isolation circuits coupled to that node to selectively facilitate or mitigate signal propagation beyond the data processing node. During an initialization process, the data logic circuit incrementally assigns an identification to each of the data processing nodes as follows. Each data processing node controls its switchable isolation circuit to mitigate signal propagation while the data logic circuit assigns an identification to that data processing node. After the assignment to a particular node, that node controls its switchable isolation circuit to allow signal propagation for assigning identification to further nodes. For instance, where each switchable isolation circuit includes respective transformers each having a first winding connected in series with one of the bus lines, the data processing node can use the switch to create open circuit condition across a second winding of each transformer, which effectively cuts or switches the bus off, until the data processing node has been assigned an identification. Later the switch can be used to create short circuit condition across the second winding of each transformer, which effectively connects or switches the bus on so that facilitates the passage of signals through the first winding to further circuit nodes on the bus.

In various embodiments, "passive" data processing nodes, such as the data processing nodes characterized above, are daisy-chained on a two-wire bus that initiates at a master node and iteratively assigned a respective identification or address, beginning with one of the data processing nodes nearest the data logic circuit. Each "passive" data processing node involves a switchable isolation circuit including two transformers and one or more switches controlled by communication logic of the data processing node. Each "passive" data processing node operates in respective states as follows. In an initiation state, such as during power up or in response to a reset signal from the master node, the switchable isolation circuit is switched off such that none of the "passive" data processing nodes initially allow signals to propagate on the bus beyond that node. The master node transmits a first signal for assigning a first identification to the first one of the "passive" data processing nodes, nearest the master node. That first node responds by storing the identification data, and operating in a communication state in which the switchable isolation circuit switched on (e.g., a switch is closed), thus allowing signals to pass the first node on the bus, to the second node. While the remaining nodes with unassigned identification remain in the initiation state, the master node then transmits a second signal for assigning a second identification to the second one of the passive data processing nodes. The second node responds, as the first node did, by storing the second identification and transitioning to the communication state in which its switchable isolation circuit is switched on. This process is repeated with each successive node until the last node (furthest from the master node) is assigned an identification, thus assigning a sequential identification to each node.

In a particular embodiment in which the data processing nodes are connected in a daisy chain architecture, the data logic circuitry is part of a master node that effects point-to-point communication with the data processing nodes. Each data processing node controls operation of one of the switchable isolation circuits that separates the data processing node from data processing nodes further along the daisy chain from the master node as follows. In response to the control-select signal indicating that the data processing node is an intended recipient of communications, the switchable isolation circuit is operated to isolate the data processing node from the further data processing nodes, by mitigating propagation of signals on the bus through switchable isolation circuit. In response to the control-select signal not indicating that the data processing node is an intended recipient of a communication from the master node, transmission of the communication is facilitated through the switchable isolation circuit to the one or more of the other data processing nodes.

In another specific example embodiment, an apparatus includes a switchable isolation circuit and communication-logic circuitry that operate to communicatively isolate a node on a communication bus, and to control passage of signals on the bus. The switchable isolation circuit includes, for each bus line, a switchable isolation transformer having a first winding for connection in series between the nodes on the bus line, and a second winding connected in series with switchable circuitry. When the first winding is connected on the bus line, its effect on isolation of the bus line is determined by state of switchable circuitry connected to the second winding. The communication-logic circuitry controls the signal isolation circuit by switching the switchable circuitry on or off, for respectively passing signals or blocking the passage of signals through the second and due to magnetic coupling thought the first, as well, winding of each switched isolation transformer. For instance, the apparatus may be implemented in multiple nodes on a two-wire bus, for initializing each node with an incremental CID after a power-up or reset by separately blocking signals from passing through each incremental node to other ones of the nodes while each node is being initialized with a CID.

The apparatus can be implemented for use in a variety of communication circuits. For instance, when the signal isolation circuit is connected in series between nodes on the communication bus in a daisy chain arrangement emanating from a master node, the switched isolation transformers mitigate the passage of signals along the bus in a direction further away from the master node. Accordingly, the signal isolation circuit may respond to an initiation event as characterized herein, by mitigating passage of signals from the master circuit node beyond the node for which the apparatus is implemented, to other circuit nodes further from the master circuit node, until the first one of the circuit nodes is assigned an identification. Thereafter the apparatus may allow signals to pass on the bus to the other ones of the circuit nodes.

A similar approach can be implemented in response to a control-select signal identifying the node being isolated, in which the isolation (mitigation of signal propagation) can be effected in response to the control-select signal for ensuing communications. Timing of the isolation may, for example, be dependent upon ensuing communications or another approach, such as by utilizing a timer. Once the communication or communication period is over, the isolation is terminated and signals are again allowed to propagate past the node having been isolated.

The apparatus may further include the bus, master circuit node connected to communicate on the bus, and other ones of the circuit nodes. The bus can be implemented as a two-wire bus connected to the circuit nodes in a daisy-chain arrangement initiating at the master circuit node. The switchable isolation circuit can be connected in series between the first one of the circuit nodes and a sequential one of the circuit nodes, with additional switchable isolation circuits (implemented similarly) being assigned/connected to one of the circuit nodes. The master circuit node operates with the switchable isolation circuits to assign an identification to each sequential one of the circuit nodes as follows. The switchable isolation circuit is used to mitigate propagation of signals beyond one of the circuit nodes while the master circuit node assigns an identification thereto. After the one of the circuit nodes has been assigned an identification, mitigation of the signal propagation is ceased, and the steps of utilizing and ceasing are repeated for sequential ones of the circuit nodes. As such, a unique identification can be assigned to each of the circuit nodes in succession, beginning with one of the circuit nodes nearest the master circuit node and ending with one of the circuit nodes furthest from the master circuit node.

Turning now to the figures, FIG. 1 shows an apparatus 100 for controlling communications on a bus with isolation, such as may be implemented with a plurality of battery packs, in accordance with one or more embodiments. The apparatus 100 includes a plurality of nodes including a master node 110 and further "passive" nodes 112-N, coupled to bus lines 105 and 106 for effecting communications. The master node 110 as shown in the inset 120 has a transceiver circuit 121 coupled to a central processor unit (CPU) in a master control unit (MCU) 122, a termination resistor 124, and an isolation transformer 125 to couple the transceiver circuit 121 to the bus. In some embodiments, a common mode chock (CMC) transformer 126 could be utilized and connected to isolation transformer 125 either from the side of the bus or from side of the transceiver 121. A variety of different arrangements of master nodes may be implemented, to suit particular applications.

One of the "passive" nodes 112 is shown in inset 130, with the understanding that other types of "passive" nodes may be implemented in place of or in conjunction with "passive" nodes as shown. "Passive" node 112 (and, e.g., other ones of the "passive" nodes) is coupled to the input bus lines 105 and 106 at bus connections 101 and 102, as shown in inset 130, and to output bus lines 107 and 108. "Passive" node 112 has a transceiver 131, switchable termination resistor 134, communication logic (COM) 132 and isolation (ISO) transformer 135 to couple the transceiver 131 to the bus. In some embodiments a common mode chock (CMC) transformer 136 could be utilized and connected to isolation transformer 135 either from side of the bus or from side of the transceiver 131 (CMC transformer 136 may thus be omitted in some embodiments). Bus switches are presented by a pair of switched isolation transformers 133 that transmits or isolates further communication propagation over the differential bus line depending from state of switches 137 and 138, which are controlled by communication logic 132.

To mitigate signal propagation beyond node 112 (to node 114 and beyond), communication logic 132 forces the switched transformers 133 to present high series impedance along the bus, by switching off switches 137 and 138. For instance, referring to the upper transformer, one of the windings 140 is connected in series with one of the signal lines of the bus, and the other winding 141 is connected to switch 137. When the switch 137 is closed, the winding 141 is short circuited, which allows current circulation through winding 141 that, in turn, permits signal propagation through winding 140 while also providing DC isolation between the bus and the switch 137. When the switch 137 is open, the winding 141 is open and thus does not allow current circulation that, in turn, blocks signals from passing further on the bus (e.g., to node 114). Each transformer can be controlled in this manner, for selectively cutting the bus off beyond node 112. Such an approach may, for example, be implemented during an initiation event for assigning an address to node 112, such as described herein.

The master node 110 may communicate with point-to-point, collision free communication, by transmitting and receiving messages with one selected passive node at a time. In some implementations, when the node 112 is selected by the master node 110 for point-to-point communication, the communication logic 132 enables the termination resistor 134 and mitigates signal propagation to further nodes of the chain though its switchable isolation circuitry, employing the switched isolation transformers 133 and switches 137 and 138. In certain implementations, the master node 110 may operate as a battery pack controller, with each battery pack having one of the passive nodes.

Various embodiments are directed to the "passive" node 130, implemented independently from the apparatus 100. For instance, "passive" node 130 may be implemented in a variety of communication-isolation environments, such as those involving automotive applications, UPS applications, energy storage systems, and others. As example, some embodiments might include two sets of bus switches, the first set being between input bus lines 105 and 106 and at bus connections 101 and 102 of transceiver 131, behind its isolation transformer 135, and the second set being, as in previously described embodiment, between bus connections 101 and 102 and output bus lines 107 and 108. This embodiment facilitates the ability to control a direction of communication and to arrange bi-directional communication in a fail-safe application having a "passive" daisy chain looped back through the second master node back to the pack controller.

In yet further embodiments, the switched isolation transformers 133 and control circuitry 132 are implemented together as a separate embodiment, for effecting isolation and selective signal blocking in a variety of environments. For instance, a plurality of circuit nodes as shown may be implemented in a two-wire automotive network such as a CAN network. Each node may be coupled for facilitating communications between vehicle systems and a master, or between different vehicle systems, such as in initiating a particular node or facilitating point-to-point communication. The control circuitry 132 can operate selectively to enable and disable signal propagation through the switched isolation transformers 133 by controlling the switches therein.

Figure 2:
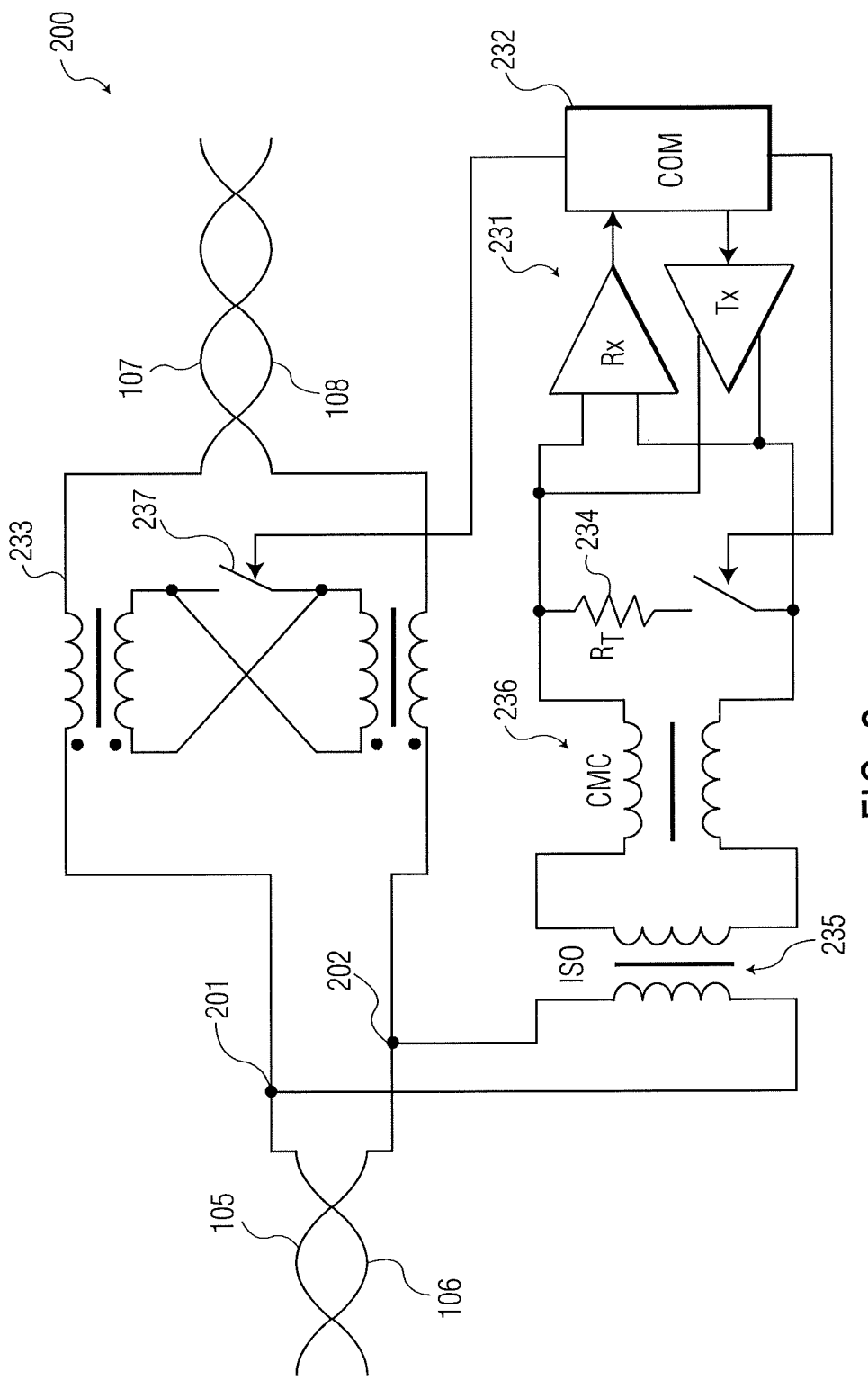
FIG. 2 shows another apparatus for communication isolation, in accordance with one or more aspects of the disclosure.

FIG. 2 shows another apparatus 200 for communication isolation, in accordance with another embodiment. The apparatus 200 may, for example, be implemented in place of passive node 130 in FIG. 1, with bus lines 105-108 shown by way of example, or in one of the other passive nodes with a combination of the passive node 130 and apparatus 200 implemented on different nodes. The apparatus 200 is connected to respective lines of a bus at 201 and 202, and includes a transceiver 231, communication logic 232, switchable termination resistor 234, isolation transformer 235 (e.g., center tapped transformer) and a CMC transformer 236. Bus switches are presented by a pair of switched isolation transformers 233 that transmit or isolate further communication propagation over the differential bus line, based on the state of a single switch 237, controlled by communication logic 232. Specific mutual connection of switched isolation transformers 233 allows not only the use a single switch 237, but also provides an effective common mode chock transformer to help and to enhance communication robustness against common mode disturbances in noisy environment.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, node, master node, "passive" node, communications circuit, MCU, and/or other circuit-type depictions (e.g., reference numerals 110, 112 and 132 of FIG. 1 depict nodes or modules as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches described herein. In certain embodiments, such a programmable circuit is or includes one or more computer circuits, including memory circuitry for storing and accessing a program to be executed as a set (or sets) of instructions (and/or to be used as configuration data to define how the programmable circuit is to perform), and an algorithm or process is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language anteced- ence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, while various two-wire bus applications are described in connection with automotive battery supplies for electric or hybrid vehicles, such communications may be implemented for battery use in homes, offices, manufacturing environments and others. In addition, various manners for mitigating signal propagation through transformer windings may be implemented, such as by driving a winding in an opposite direction relative to signal propagation, in addition to and/or as an alternative to opening a circuit in such a winding. As another example, battery management for so-called green energy sources, such as solar and wind, can be effected using one or more approaches characterized herein. Such modifications do not depart from the true spirit and scope of various aspects of the disclosure, including aspects set forth in the claims.

What is claimed is:

1. A data communication circuit comprising:
a differential bus configured and arranged to convey data differentially;
a plurality of data processing nodes, each including logic circuitry and each communicatively coupled to the differential bus;
a data logic circuit configured and arranged to facilitate communications for each of the plurality of data processing nodes over the differential bus by identifying each of the data processing nodes, and by using the identification to communicate with one of the plurality of data processing nodes; and
a plurality of switchable isolation circuits including a transformer and switching circuitry, each switchable isolation circuit coupled to one of the plurality of data processing nodes and being configured and arranged with the data logic circuit to control signal propagation over the differential bus between the one of the plurality of data processing nodes and an adjacent one of the data processing nodes via the transformer, and the switching circuitry configured to mitigate the signal propagation by causing the transformer to operate in a high impedance state and to cause a change of impedance at the transformer to effect the signal propagation to the adjacent one of the plurality of data processing nodes by operating the transformer in a low impedance state, the transformer having a first winding being connected to the switching circuitry and a second winding connected in series with a bus line of the differential bus between the one data processing node and the adjacent data processing node.

2. The circuit of claim 1, wherein
the data processing nodes are connected in series on the differential bus, each data processing node being configured and arranged to control operation of the one of the switchable isolation circuits coupled thereto; and
each switchable isolation circuit is configured and arranged with the data logic circuit to, during an initialization process in which the data logic circuit incrementally assigns an identification to each of the data processing nodes,
    mitigate signal propagation beyond the data processing node that controls operation thereof by switching the switching circuitry of the transformer to an off state and therein increasing impedance of the transformer, with the transformer coupled in series to signal propagation on the bus, and
    in response to the data logic circuit assigning an identification to said data processing node, facilitate signal propagation beyond said data processing node, for assigning identification to a further one of the data processing nodes, by switching the switching circuitry to an on state, thus decreasing impedance of the transformer.

3. The circuit of claim 2, wherein, for each switchable isolation circuit and the data processing node configured to control said switchable isolation circuit:
a first winding of the transformer is connected in series with the bus line of the differential bus between the data processing node and the adjacent one of the plurality of data processing nodes that is further on the differential bus from the data logic circuit; and
a second winding of the transformer is connected to the switching circuitry, the switching circuitry being configured and arranged to selectively create either an open circuit or a short circuit connection across terminals of the second winding in response to the logic circuitry in one of the plurality of data processing nodes, and therein switching impedance of the first winding of the transformer into the low or high impedance state, to correspondingly transmit or mitigate passage of signals through the first winding to the adjacent one of the plurality of data processing nodes.

4. The circuit of claim 1 wherein
each switchable isolation circuit is connected to and controlled by one of the data processing nodes for mitigating the passage of signals to the adjacent one of the data processing nodes on the differential bus; and
for each switchable isolation circuit and the data processing node that controls the switchable isolation circuit, a first winding of the transformer is connected in series with the bus line of the differential bus between the data processing node and the adjacent one of the data processing nodes; and a second winding of the transformer is connected to a switch in the switching circuitry, the data processing node being configured and arranged to open the switch and therein create an open circuit in the second winding to prevent current circulation through the second winding and to prevent signals from propagating through the first winding to the adjacent one of the data processing nodes.

5. The circuit of claim 1, wherein
for each of the data processing nodes, one of the plurality of switchable isolation circuits is assigned thereto and configured and arranged to mitigate signal propagation on the differential bus beyond the data processing node to which it is assigned; and each of the plurality of switchable isolation circuits is configured and arranged to mitigate the signal propagation by decoupling a winding of the transformer during an initiation event in which the data processing node to which the switchable isolation circuit is assigned is provided with an identification or address by the data logic circuit, and to cease mitigating the signal propagation thereafter by coupling the decoupled winding.

6. The circuit of claim 5, wherein the data logic circuit is configured and arranged with the switchable isolation circuits to iteratively assign a respective identification or address to sequential ones of the data processing nodes, beginning with one of the data processing nodes nearest the data logic circuit, using the switchable isolation circuits to mitigate propagation of a signal used to assign the identification or address beyond each data processing node as the data processing node is being assigned.

7. The circuit of claim 1, further including at least one common mode choke transformer configured and arranged to suppress common mode noise induced by data carried over the differential circuit.

8. The circuit of claim 1, wherein at least one of the plurality of switchable isolation circuits is configured and arranged to provide galvanic isolation.

9. The circuit of claim 1, wherein the plurality of data processing nodes are configured and arranged in a daisy chain architecture.

10. The circuit of claim 1, wherein:
the plurality of data processing nodes are connected in a daisy chain architecture;
the data logic circuit is part of a master node that assigns an identification to each of the data processing nodes and thereafter effects point-to-point communication with each of the data processing nodes using the assigned identification; and
each of the data processing nodes is configured and arranged to control operation of one of the plurality of switchable isolation circuits that separates the data processing node from one or more of the other data processing nodes further from the master node in the daisy chain architecture, by
operating the switchable isolation circuit to prevent signals from passing to one or more of the other data processing nodes during an initiation event in which the master node assigns the identification to the data processing node, by increasing impedance of the transformer; and after the data processing node has been assigned an identification, facilitate passage of signals transmissions from the master node through the switchable isolation circuit to one or more of the other data processing nodes by decreasing impedance of the transformer.

11. The circuit of claim 1, further including at least one repeater for transmitting or receiving data between the differential bus and at least one of the plurality of data processing nodes.

12. The circuit of claim 1, wherein each data processing node includes a termination resistor circuit configured and arranged to facilitate communications between the data processing node and the data logic circuit by matching impedance therewith.

13. The circuit of claim 12, further including a switch configured and arranged to selectively couple the termination resistor circuit for impedance matching.

14. An apparatus comprising:
a communication bus having at least two bus lines;
a switchable isolation circuit configured and arranged to mitigate signal propagation between a plurality of circuit nodes on the communication bus, the switchable isolation circuit including, for each bus line, switching circuitry and a switched isolation transformer having a first winding configured and arranged for connection in series between the circuit nodes on one of the at least two bus lines, and a second winding connected to the switching circuitry and configured and arranged with the switching circuitry to effect isolation of the bus line connected in series with the first winding;
in a first one of the circuit nodes, communication-logic circuitry configured and arranged for connection to the bus lines for communicating data thereon, and including a logic circuit configured and arranged to, in response to a communication event involving the first one of the circuit nodes, switch the switching circuitry connected to the second winding off to mitigate passage of signals through the first winding of each switched isolation transformer;
a master circuit node connected to communicate on the communication bus; and
the plurality of the circuit nodes including the first one of the circuit nodes,
wherein the master circuit node is configured and arranged with the switchable isolation circuit to assign an identification to each sequential one of the circuit nodes by,
utilizing the switchable isolation circuit for one of the circuit nodes to mitigate propagation of signals beyond the one of the circuit nodes while the master circuit node assigns an identification thereto, and
after the one of the circuit nodes has been assigned an identification, ceasing mitigating the propagation of signals.

15. The apparatus of claim 14, wherein
the first one of the circuit nodes is connected with other ones of the circuit nodes on the communication bus in a daisy chain arrangement extending from the master circuit node, and
the switchable isolation circuit is configured and arranged to respond to an initiation event in which each of the circuit nodes is assigned an identification, by mitigating passage of signals on the bus from the master circuit node to other ones of the circuit nodes further from the master circuit node than the first one of the circuit nodes in the daisy chain arrangement, until the first one of the circuit nodes is assigned an identification, and thereafter facilitating passage of signals on the bus to the other ones of the circuit nodes.

16. The apparatus of claim 14, wherein the communication-logic circuitry is configured and arranged with the switching circuitry to switch the second winding off by creating an open circuit in the second winding and therein prohibiting current from circulating in the second winding and mitigating passage of signals through the first winding, the transformer being connected to the switching circuitry and connected to the bus between the first one of the circuit nodes and a sequential one of the circuit nodes.

17. The apparatus of claim 14,
the bus being a two-wire bus connected to the circuit nodes in a daisy-chain arrangement initiating at the master circuit node;
the switchable isolation circuit being connected in series between the first one of the circuit nodes and a sequential one of the circuit nodes;
further including additional ones of the switchable isolation circuit, with one of the switchable isolation circuits being connected between each of the circuit nodes beginning with the sequential one of the circuit nodes; and
wherein the master circuit node is further configured and arranged with the switchable isolation circuits to assign an identification to each sequential one of the circuit nodes by
repeating the steps of utilizing and ceasing for sequential ones of the circuit nodes, therein assigning the identification to each of the circuit nodes in succession, beginning with one of the circuit nodes nearest the master circuit node and ending with one of the circuit nodes furthest from the master circuit node.

18. A method for communicating between circuit nodes communicatively coupled to a bus having at least two bus lines connected to each of a plurality of circuit nodes, the method comprising:

in response to an initiation event, isolating the circuit node from an adjacent one of the circuit nodes using a switchable isolation circuit including, for each bus line, a switched isolation transformer having a first winding connected in series on one of the at least two bus lines between the circuit node and an adjacent one of the plurality of circuit nodes and a second winding, by preventing current from circulating in the second winding to mitigate passage of signals on the bus line through the first winding; and
identifying or assigning an address to the circuit node while utilizing the switchable isolation circuit to mitigate propagation of signals to the adjacent one of the circuit nodes,
wherein for each bus line, the switched isolation transformer having a first winding connected in series on one of the at least two bus lines between the adjacent circuit node and a further adjacent one of the plurality of circuit nodes and a second winding, by
preventing current from circulating in the second switched control winding to mitigate passage of signals on the bus line through the first winding, and
identifying or assigning the address to the adjacent circuit node while utilizing the switchable isolation circuit to mitigate propagation of the signals to the further adjacent one of the circuit nodes.

19. The method of claim 18 wherein, after the circuit node has been identified or assigned an address,
ceasing mitigating the propagation of signals, and
isolating said adjacent one of the circuit nodes from the further adjacent one of the circuit nodes using another one of the switchable isolation circuits.

20. The method of claim 19, wherein the steps of isolating and identifying or assigning are carried out for sequential ones of the circuit nodes in response to the initiation event, until all circuit nodes have been identified or assigned an address.

* * * * *